US012353666B2

(12) United States Patent
Parekh et al.

(10) Patent No.: US 12,353,666 B2
(45) Date of Patent: Jul. 8, 2025

(54) BEZEL ENABLED TOUCHABLE OLED DISPLAY FOR WEARABLES

(71) Applicant: Google LLC, Mountain View, CA (US)

(72) Inventors: Premal Parekh, Milpitas, CA (US); Young Seok Oh, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/275,240

(22) PCT Filed: Jun. 8, 2021

(86) PCT No.: PCT/US2021/036339
§ 371 (c)(1),
(2) Date: Aug. 1, 2023

(87) PCT Pub. No.: WO2022/260652
PCT Pub. Date: Dec. 15, 2022

(65) Prior Publication Data
US 2024/0152242 A1 May 9, 2024

(51) Int. Cl.
*H10K 59/40* (2023.01)
*G04G 17/04* (2006.01)
(Continued)

(52) U.S. Cl.
CPC ......... *G06F 3/0448* (2019.05); *G04G 17/045* (2013.01); *G04G 21/08* (2013.01); *H10K 59/40* (2023.02); *G06F 2203/04102* (2013.01); *G06F 2203/04103* (2013.01); *H10K 2102/311* (2023.02)

(58) Field of Classification Search
CPC ......... G06F 3/0448; G06F 2203/04102; G06F 2203/04103; G06F 3/04164; G06F 2203/04111; G06F 3/0446; G04G 17/045; G04G 21/08; H10K 59/40; H10K 2102/311
See application file for complete search history.

(56) References Cited

U.S. PATENT DOCUMENTS

2009/0096760 A1* 4/2009 Ma ..................... G06F 3/0446
345/174
2016/0357317 A1* 12/2016 Kim ..................... G06F 3/04166
(Continued)

OTHER PUBLICATIONS

Office Action for Japanese Patent Application No. 2023-548917 dated Aug. 6, 2024. 4 pages.
(Continued)

*Primary Examiner* — Antonio Xavier
(74) *Attorney, Agent, or Firm* — Lerner David LLP

(57) ABSTRACT

The present disclosure provides an electronic device utilizing a flexible display panel having a plurality of bendable flaps formed in a periphery bending portion of the flexible display panel. The flexible display panel may have a circular shape utilized in a wearable device. An active and touch sensitive area for displaying images and receiving touch input may extend to the periphery bending portion of the flexible display panel, thus providing a wide viewing range and extending touch sensitive area of utilization as well as enhancing an overall aesthetic appearance of the electronic device.

20 Claims, 10 Drawing Sheets

(51) Int. Cl.
*G04G 21/08* (2010.01)
*G06F 3/044* (2006.01)
*H10K 102/00* (2023.01)

(56) References Cited

U.S. PATENT DOCUMENTS

| | | | |
|---|---|---|---|
| 2017/0168463 A1 | 6/2017 | Hong et al. | |
| 2018/0062090 A1* | 3/2018 | Kim | H10K 59/873 |
| 2020/0241664 A1* | 7/2020 | Lee | G06F 3/03547 |
| 2020/0319043 A1* | 10/2020 | Rosenberg | G06F 1/1641 |
| 2020/0372850 A1 | 11/2020 | He et al. | |
| 2021/0277284 A1* | 9/2021 | Everaerts | C09J 7/401 |

OTHER PUBLICATIONS

Motorola Mobility LLC. Using the Edge display—motorola edge +. 2021. Retrieved on Mar. 18, 2021. Retrieved from the Internet: <https://support.motorola.com/us/en/products/cell-phones/motorola-edge-family/motorola-edge-plus/documents/MS150210>. 4 pages.
Chowdhry, A. 26 Samsung Galaxy S8 And Galaxy S8 Plus Tips and Tricks You Should Know About. May 17, 2017. Retrieved on Mar. 18, 2021. Retrieved from the Internet <https://www.forbes.com/sites/amitchowdhry/2017/05/17/galaxy-s8-tips-and-tricks/?sh=33a8b0c737a7>. 54 pages.
International Search Report and Written Opinion for International Application No. PCT/US2021/036339 dated Mar. 2, 2022. 13 pages.
Notice of Grant for Japanese Patent Applicaton No. 2023-548917 dated Dec. 3, 2024. 3 pages.

\* cited by examiner

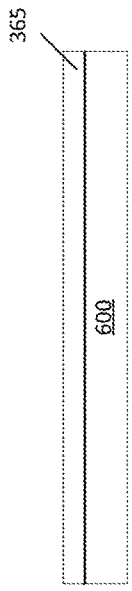
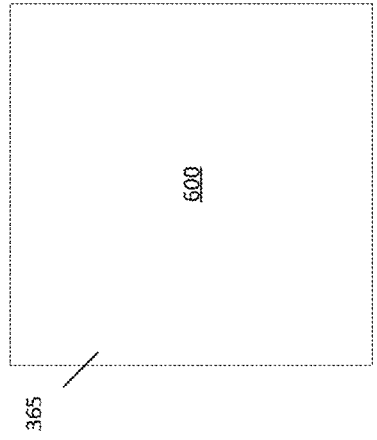
FIG. 6A
FIG. 6B
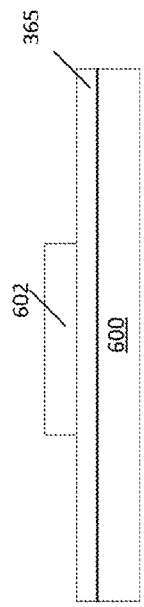
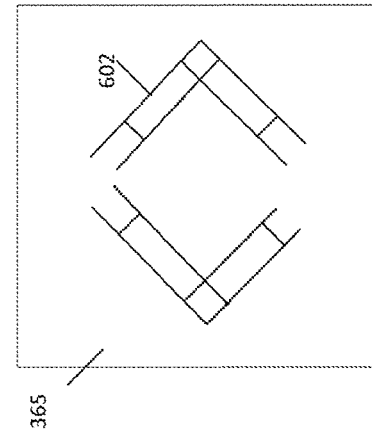
FIG. 7A
FIG. 7B

BEZEL ENABLED TOUCHABLE OLED DISPLAY FOR WEARABLES

CROSS-REFERENCE TO RELATED APPLICATIONS

This application is a national phase entry under 35 U.S.C. § 371 of International Application No. PCT/US2021/036339, filed Jun. 8, 2021, the disclosure of which is hereby incorporated herein by reference.

BACKGROUND

Electronic devices often include a display assembly to display content to a user. For example, portable devices, personal digital assistants, wearable devices, such as smartwatches and smart glasses, and the like, often include the display assembly for presenting content and information to a user. The electronic device may have a housing, such as a housing formed from plastic or metal, that exposes an active area of the display to display the content. Some designs seek to maximize an active area of the display panel relative to the overall device footprint, such as by minimizing the non-displayable area at borders, bezel or edges of the display panel. For example, reduction of the relative size of the housing at the borders of the active area of the display enhances an overall aesthetic of the display assembly.

In order to maximize the active area of the display, a curved housing, such as a curved cover glass, may be utilized to extend the active area of the display to the bezel region of the display assembly. However, the active area in the bezel region is not sensitive to touch input from the users. Rather, in such structures, buttons or other mechanical structures are still needed to enable control from the bezel region of the wearable devices.

SUMMARY

The present disclosure provides a flexible display panel for an electronic device. The flexible display panel has one or more touch sensors located at a bezel region of the electronic device. In one example, a display assembly includes a flexible display panel positioned beneath a cover layer, the flexible display panel having a bending portion formed at a periphery region of the flexible display panel. A plurality of relief features is formed in the bending portion of the flexible display panel to form a plurality of bendable flaps in the periphery region of the flexible display panel. A first plurality of touch sensors is formed on the bendable flaps of the flexible display panel.

In one example, the flexible display panel includes a planar portion formed on a center region of the flexible display panel. The planar portion has a circular shape. A second plurality of touch sensors is formed in the planar portion of the flexible display panel.

In one example, the second plurality of touch sensors is in electrical communication with a display device integrated circuit. The second plurality of touch sensors is connected to the display device integrated circuit through routing wires that run through an active area between the touch sensors. The first plurality of touch sensors is in electrical communication with a display device integrated circuit through routing wires disposed on an inactive area formed in the bendable flaps. The first and the second plurality of touch sensors collectively couple to a display device integrated circuit.

In one example, each bendable flap includes one or more touch sensors from the first plurality of the touch sensors. The first plurality of touch sensors includes a transmitter electrode and a receiver electrode formed in a common layer. A jumper wire is coupled to the transmitter electrode. The jumper wire is formed in a metal layer below or above an insulating material in contact with the common layer. The jumper wire is coupled to the transmitter electrode through a connection plug formed in the insulating material. The flexible display panel further includes an active area formed in the bending portion of the flexible display panel. An OLED film stack is formed under the first plurality of touch sensors.

In one example, an optically clear adhesive disposed between the OLED film stack and the first plurality of the touch sensors. The display assembly is integrated in a wearable device. The bending portion of the flexible display panel has a curvature that fits with a curved side region of the cover layer.

Another aspect of the present disclosure includes an electronic device. The electronic device includes a cover layer. A flexible display panel has a planar center region and a curved periphery region. The curved periphery region includes a plurality of bendable flaps. The planar center region has a circular shape. The curved periphery region is touch sensitive.

Each bendable flap of the plurality of bendable flaps includes one or more touch sensors. An OLED film stack is formed below the one or more touch sensors. Each touch sensor of the one or more touch sensors disposed in each bendable flap is connected in series.

Yet another aspect of the present disclosure includes a method for forming a display assembly for an electronic device. The method includes forming a plurality of bendable flaps in a periphery region of a flexible display panel, folding the bendable flap of the flexible display panel, and forming one or more touch sensors in the plurality of the bendable flaps in the periphery region of the flexible display panel.

BRIEF DESCRIPTION OF THE DRAWINGS

FIGS. 6A-6B, 7A-7B, 8A-8B, 9A-9B depict cross-sectional views and top views, respectively, of an example touch sensor during different manufacturing stages in accordance with aspects of the disclosure.

DETAILED DESCRIPTION

The present disclosure provides for an electronic device utilizing a flexible display panel to present or display information, content, or images to a user. The electronic device may be a portable device, a wearable device or other electronic device. In one example, the electronic device is a smartwatch. The electronic device includes a flexible display panel embedded therein, the flexible display panel having multiple bending portions which form bendable flaps. A plurality of touch sensor devices may be disposed in a bezel region formed by the bendable flaps of the flexible display panel. The bezel region formed by the bendable flaps of the flexible display panel may have a curvature that fits with and attaches to a curved side portion of a curved cover layer.

In one example, a first plurality of touch sensors formed in the bezel region of the electronic device and a second plurality of touch sensors formed in a planar region of the electronic device. The second plurality of touch sensors is in electrical communication with a display device integrated circuit. The second plurality of touch sensors is connected to the display device integrated circuit through routing wires that run through an active area between the touch sensors. The first plurality of touch sensors is in electrical communication with a display device integrated circuit through routing wires disposed on an inactive area formed in the bendable flaps.

Thus, the touch sensitive active area of the flexible display panel may extend to the bezel region of the electronic device so as to provide additional active and touch sensitive areas for utilization in the electronic device. Thus, buttons or other mechanical structures conventionally located in the bezel region of the electronic device may be eliminated. In this regard, overall device aesthetics and utilization area may be enhanced, and user experience and satisfaction may also be improved.

Figure 1:
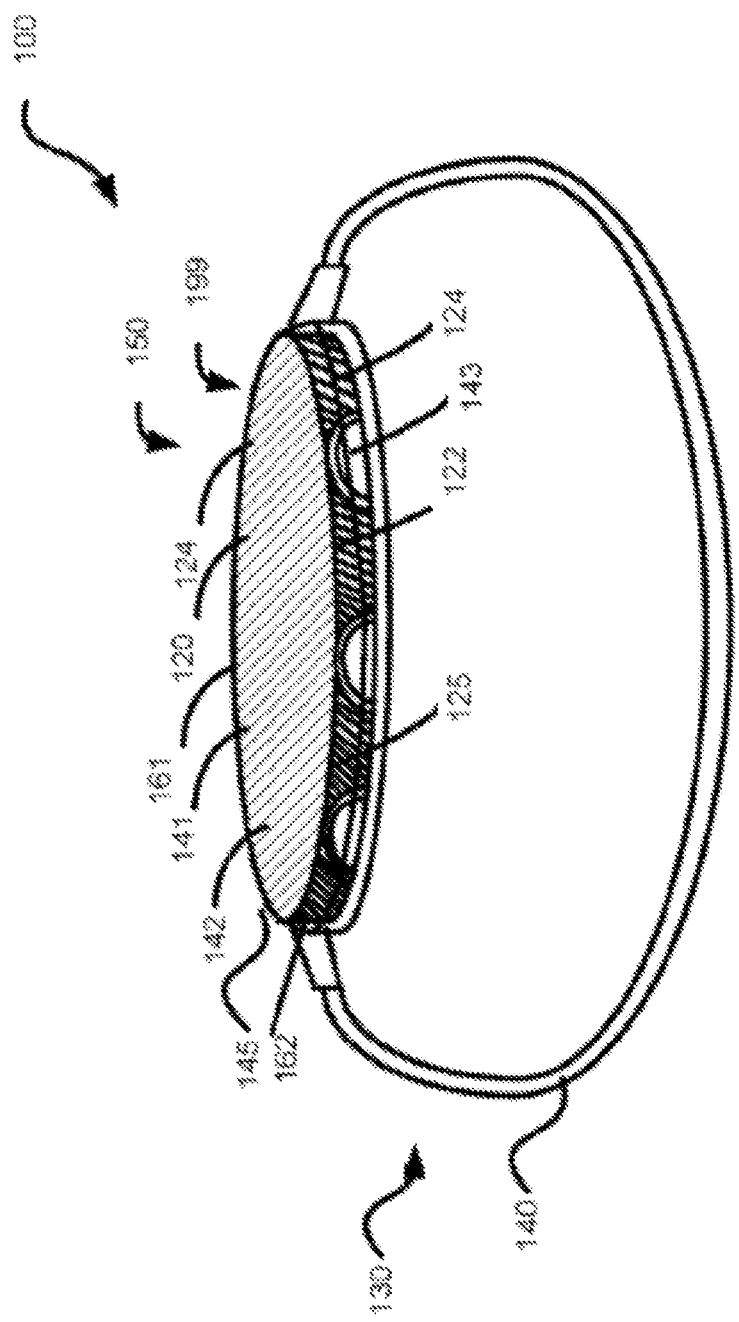
FIG. 1 depicts an example smartwatch with a flexible display panel in accordance with aspects of the disclosure.

FIG. 1 illustrates an example electronic device. In this example, the electronic device is a wearable device, such as a smartwatch 100. However, it should be understood that the wearable device may be any of a variety of wearable devices, such as pendants, head-mounted displays, smart glasses, smart helmets, earbuds, or any of a variety of other devices.

The smartwatch 100 includes a watch body 145. A housing 199 is utilized to enclose the watch body 145. While in the example shown that the watch body 145 is round or circular in shape, the watch body 145 may be any shape, such as rectangular, square, irregular, oval, polygon, arbitrary shape, etc. The watch body 145 may include a display assembly 150. The display assembly 150 includes a cover layer 141 and a display panel 142 disposed under the cover layer 141. In one example, the cover layer 141 may be made from a variety of materials, such as metal, plastic, glass, ceramics, or any combination of these or other material. In the example depicted herein, the cover layer 141 is made by a transparent material, such as glass.

The display panel 142 may be an organic light-emitting diode (OLED) display or other suitable displays. The display panel 142 may include a planar portion 120 and a bending portion 122. The bending portion 122 is formed at a bezel region, periphery region, border region or edge region of the display panel 142 in connection with the planar portion 120. The bending portion 122 allows extension of an active area 124 and a touch sensitive area from the planar portion 120 to the border/corner/bezel region of the watch body 145 for continuously displaying content, information, or images in the display panel 142. A plurality of touch sensitive devices may be disposed in the bending portion 122 so that the border/corner/bezel region of the watch body 145 may not only be used for displaying content, but also for receiving touch sensitive or touch controllable commands or input from a user. Thus, a continuous display and touch sensitive region from the planar portion 120 extending to the bending portion 122 of the display panel 142 may be provided for a wide viewing range and angle to the user, such as high screen-body ratio for "all-screen" design, as well as enhancing an overall aesthetic appearance and increased utilization/operable area of the watch body 145.

In one example, the active area 124 includes arrays of touch sensors and arrays of display pixels vertically stacked up so that an image may be displayed while simultaneously detecting a touch operation from a user's input. The touch sensors (not viewable in FIG. 1) are disposed between a touch surface, such as the cover layer 141, and the display panel 142, where the display pixels are located, to detect touch input based on changes in capacitance, such as the change in capacitance between a receiver electrode and a transmitter electrode disposed in the touch sensors. Other suitable touch sensors may also be utilized to receive touch input from a user. The touch sensors may be formed on the planar portion 120 as well as the bending portion 122 of the display panel 142. Details of the structures of the touch sensors will be described below with reference to FIG. 6A-10.

In one example, the display pixels may include at least one switching thin-film transistor (TFT) and at least one driving TFT. Each pixel circuit may be electrically connected to a gate line and a data line, and communicates with the driving circuits, such as a gate driver and a data driver, positioned in the inactive area of the display panel 142 to operate the associated pixel.

Furthermore, the display panel 142 may also include components with different functions other than for operating the pixels and touch input located in the active area 124. For example, the display panel 142 may include components for providing a tactile feedback process and/or various other processes or operations for the electronic device utilized in the display panel 142.

The bending portion 122 of the display panel 142 may eliminate, reduce or minimize an inactive area seen from the front side of the display assembly 150. By utilizing the bending portion 122 at an edge, bezel, border, or periphery region of the display panel 142, the inactive area of the display panel 142 may be minimized, such as non-viewable by a user from the front side, so the active area of display in the display panel 142 be maximized and the overall device aesthetics may be enhanced.

In one example, the planar portion 120 may have a round or circular shape. The planar portion 120 may also have irregular, polygon or other suitable shapes.

A plurality of the relief features 143 are formed in the bending portion 122 of the display panel 142, forming a plurality of bendable flaps 125 in the edge, bezel, border, or periphery region of the display panel 142. The relief features 143 may relieve mechanical or bending stresses associated with bending at the bending portion 122. The relief features 143 may be cut-out portions or cut-out structures that remove some of the materials from the periphery region of the display panel 142. The relief features 143 may be in any configuration, pattern or dimensions. For example, the relief features 143 may be shaped in an arc configuration, triangular configuration, oval configuration, semi-circular configuration or other suitable configurations. In the example depicted herein, some of the relief features 143 may be omitted or may be altered from the forms shown, for example, through formation of more or less relief features 143, the relief features 143 of differing cross-sections, numbers or shapes than those shown, or through other structures of relieving mechanical stresses associated with bending at the bending portion 122.

Figure 3:
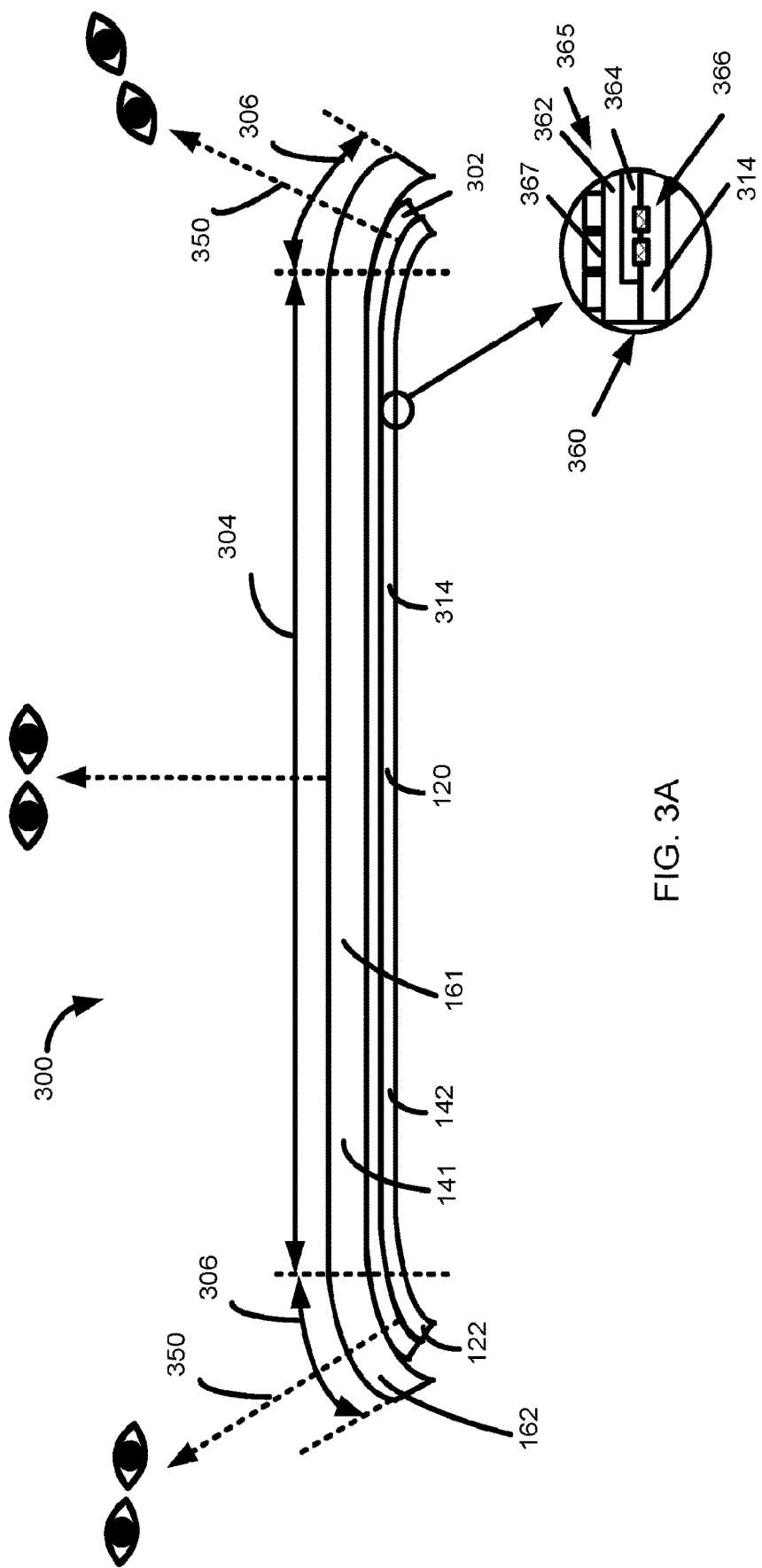
FIGS. 3A-3B depicts a cross sectional view of a display assembly in accordance with aspects of the disclosure.

The cover layer 141 may be attached or bonded to the display panel 142 by a lamination process. In one example, the cover layer 141 includes a planar region 161 and a curved side region 162. The planar region 161 is bonded to the planar portion 120 of the display panel 142 while the curved side region 162 is bonded to the bending portion 122 of the display panel 142. An adhesive material 302, as shown in FIG. 3A, may be utilized for bonding the cover layer 141 to the display panel 142 within minimum interface defects, such as bubbles or interstitial gaps. The touch sensors may be disposed both on the planar portion 120 and on bending portion 122 of the display panel 142 and below the cover layer 141. The cover layer 141 may act as a touch interface that may receive touch input from a user. The relief features 143 formed in the bending portion 122 of the display panel 142 also assist minimizing interstitial gaps or discharging air during the lamination process so as to prevent wrinkle or cracks and provide a good fitting interface. As the active area of the display panel 142 is extended to the bending portion 122, including the touch sensors formed on the active area of the display panel 142, buttons or other mechanical structures may be eliminated from the bezel region of the smartwatch 100. This may reduce the manufacturing complexity and cost during the lamination process.

The smartwatch 100 may include one or more accessories, such as a watch band 130. In other examples where the smartwatch 100 is a different device, the body of the device may have a different type of accessory. For example, a pendant may include an accessory such as a necklace. The watch band 130 may be made from a variety of materials, such as metal, rubber, nylon, cotton, plastic, glass, ceramics, or any combination of these or other material. The watch band 130 may be adapted to be worn around a person's wrist. For example, the watch band 130 includes a strap 140. The strap 140 may be adjusted to provide a secure and comfortable fit around the wrist of the wearer. In other examples, the watch band may be a bracelet, such as for a looser fit, or another type of attachment mechanism.

Figure 2:
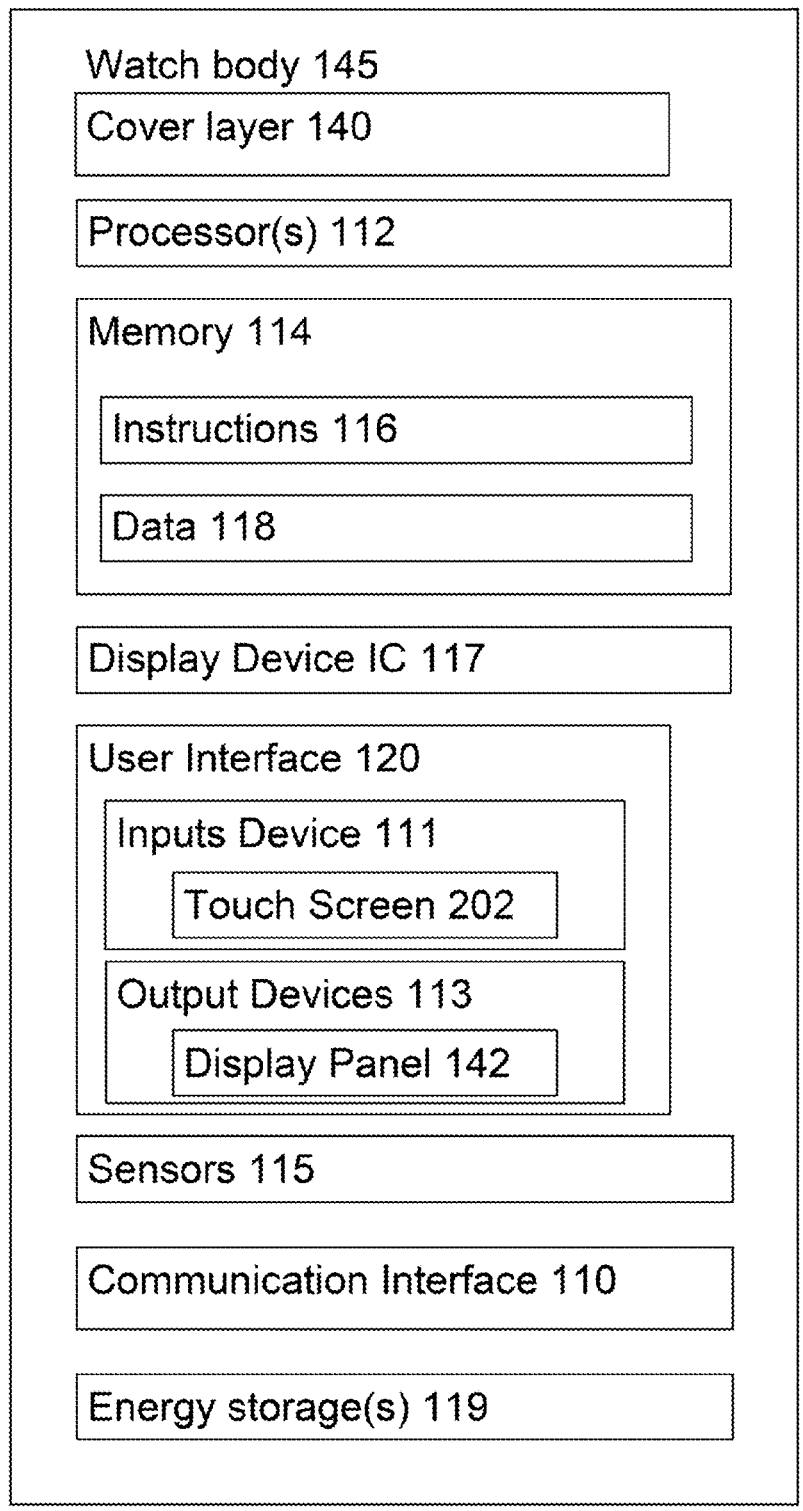
FIG. 2 is an example functional block diagram of an example electronic device in accordance with aspects of the disclosure.

FIG. 2 is a block diagram of an example of the watch body 145 in the smartwatch 100, 190 that includes multiple electronic components, including the display panel 142 laminated with the cover layer 140. The example block diagram depicted herein should not be considered as limiting the scope of the disclosure or usefulness of the features described herein. In the example as shown, the watch body 145 may contain one or more processors 112, memory 114 and other components typically present in general purpose computing devices.

Memories 114 may store information accessible by the one or more processors 112, including instructions 116, that can be executed by the one or more processors 112. Memories 114 can also include data 118 that can be retrieved, manipulated or stored by the processors 112.

Further as shown in FIG. 2, the watch body 145 may include a user interface 120 that includes one or more input devices 111 and one or more output devices 113. For example, the input device 111 may include a touch screen 202 and output device 113 may include the display panel 142. Other components, such as soft actuators, periphery devices, sensors, and/or other suitable features may also be included in the user interface 120. It is noted that the touch screen 202 and the display panel 142 as described herein may refer to the same object to provide multiple functionalities. For example, the display panel 142 may not only display content but also provides a touch-activated interface, referred to as the touch screen 202 that allows the user to input commands and to actively interact therewith. In some examples, the touch screen 202 may include multiple touch sensors disposed on the display panel 142, or an underside layer formed on an undersurface of the cover layer 140.

Users may be able to interact with the smartwatch 100 using the input device 111, such as opening a webpage or an email, writing a message, controlling display or audio functionalities, controlling sensors to monitor heart rate or body temperature, locating by GPS, etc. The watch body 145 may include the one or more output devices, such as output devices 113. For example, the output devices 113 may include one or more speakers, transducers or other audio outputs, the display panel 142, a haptic interface or other tactile feedback that provides non-visual and non-audible information to the user. For example, the display panel 142 in the output devices 113 may display visual information, content or images to the user, such as texts, graphics, videos, etc. As another example, speakers in output devices 113 may be used to play music, emit audio for navigational or other guidance, for multimedia files, for voice calls, for translated speech, etc. Further, haptic or tactile feedback in the output devices 113 may be used to generate non-visual and non-audible alerts, such as by vibration.

The watch body 145 may include one or more sensors, such as sensors 115, other than touch sensors utilized in the touch screen 202. For example, sensors may include a visual sensor, an audio sensor, a touch sensor, etc. Sensors may also include motion sensors, such as an Inertial Measurement unit ("IMU"). According to some examples, the IMU may include an accelerometer, such as a 3-axis accelerometer, and a gyroscope, such as a 3-axis gyroscope. The sensors may further include a barometer, a vibration sensor, a heat sensor, a radio frequency (RF) sensor, a magnetometer, a barometric pressure sensor, a heart rate sensor, a body temperature sensor. Additional or different sensors may also be employed. In some examples, sensors 115 may include sensors for detecting a battery state, a presence of a wireless charging device, or any of a variety of other conditions.

Watch body 145 may include a communication interface 110. The communication interface 110 may enable exchange of information with other devices. The communication interface 110 may include a communication receiver and transmitter system to modulate and transmit signals for data or signal transmission. The communication interface 110 may be controlled by the processors 112. In some examples, the communication interface 110 may be configured to transmit and/or receive data according to a wireless signal transmission standard, such as a Bluetooth standard or other suitable standard.

The communication interface 110 may enable wireless network connections, wireless ad hoc connections, and/or wired connections. The communication systems may be configured to support communication via cellular, LTE, 4G, 5G, WiFi, GPS, and other networked architectures. The communication interface 110 may be configured to support Bluetooth®, Bluetooth LE, near field communication (NFC) standards, Qi standards, and non-networked wireless arrangements. The communication interface 110 may support wired connections such as a USB, micro USB, USB type C or other connector, for example to receive data and/or power from a laptop, tablet, smartphone or other device.

The watch body 145 may include one or more energy storages, such as energy storages 119 configured to receive and store power generated. In one example, the energy storage 119 may be a battery.

The watch body 145 also includes a display device integrated circuit (DDIC) 117 that may be in electrical communication to the touch screen 202 and the display panel 142 in the user interface 120. The DDIC 117 may control and provide a desired level of display resolution for the display panel 142. The DDIC 117 provides an interface between processor(s) 112 and the display panel 142. The DDIC 117 transmits electrical signals to activate the arrays of pixels and the touch sensors in the display panel 142 to ultimately produce an image and receive touch input on the display panel 142.

Although not shown, the watch body 145 may also include other additional components. For example, the watch body 145 may include a position determination module, which may include a GPS chipset or other positioning system components. Information from the sensors and/or from data received or determined from remote devices, such as wireless base stations or wireless access points, can be employed by the position determination module to calculate or otherwise estimate the physical location of the watch body 145 and/or watch band 130. As another example, the watch body 145 may include one or more internal clocks. The internal clocks may provide timing information, which can be used for time measurement for apps and other programs run by the computing devices, and basic operations by the computing devices, sensors, inputs/outputs, GPS, communication system, etc.

Although the components shown in FIG. 2 are included in the watch body 145, it is noted that the one or more components of FIG. 2 may also be implemented or configured in other places of the smartwatch 100, such as the watch band 130.

FIG. 3A depicts a cross sectional view of a display assembly 300 including the cover layer 141 and the display panel 142 bonded through adhesive material 302. In one example, the adhesive material 302 may be an optically clear adhesive (OCA). It is noted that the example depicted in FIG. 3A is just for illustration purposes. Some components, such as devices, transistors, signal lines, or other details or components are not shown in FIG. 3A for ease of description.

The cover layer 141 may be a transparent material utilized to protect the display panel 142. The cover layer 141 may be formed from a flexible material, such as plastic, or a more rigid material, such as glass. The cover layer 141 may serve as a touch surface or an input surface to receive a touch input from a user to trigger operations in the touch sensors.

The display assembly 300 generally includes a planar zone 304, such as a center zone, and a curved zone 306, such as a periphery zone, formed on an edge, bezel, border, or periphery region of the display assembly 300. The planar zone 304 includes the planar region 161 in the cover layer 141 bonded to the planar portion 120 from the display panel 142 while the curved zone 306 includes the curved side region 162 from the cover layer 162 bonded to the bending portion 122 from the display panel 142. The planar zone 304 may have substantially a round or circular shape when viewed from a top view (not shown). In other examples, the planar zone 304 may be oval shaped, irregularly shaped, polygonal, or other suitable shapes. The curved side region 162 of the cover layer 141 may provide a curved surface with a desired curvature to be fit to the bending portion 122 from the display panel 142.

The curved zone 306 of the display assembly 300 provides bezel-minimizing effects on the edges of the display assembly 300, thus providing an immersive visual experience 350 and aesthetic to users as well as improving the utilized active area of the display panel 142.

Furthermore, as the touch sensors are also formed on the bending portion 122 of the display panel 142, the curved zone 306 in the display panel 142 may also be touch sensitive or touch operable to receive touch commands or touch input from the users.

In one example, the display panel 142 may be a flexible display including multiple structures formed on a substrate 314. FIG. 3B depicts a magnified view of a portion of the display panel 142 having structures 360 formed on the substrate 314 of the display panel 142. Structures 360 formed in the display panel 142 include arrays of touch sensors 367 formed on arrays of pixels formed in an OLED film stack 365. For example, the OLED film stack 365 for emitting light for displaying images is disposed on the substrate 314. The OLED film stack 365 includes an encapsulating layer 362 formed on an organic light emitting material layer 364 having a plurality of thin film transistor devices 366 formed thereon. Each pixel may be associated with a pixel circuit, which includes at least one switching thin-film transistor (TFT) device and at least one driving TFT device. Each pixel circuit may be electrically connected to a gate line and a data line and communicate with the driving circuits, such as a gate driver and a data driver to operate the associated pixel. A base layer, such as the substrate 314, is then formed in contact with the organic light emitting material layer 364. The substrate 314 may include a thin flexible plastic film formed from polyimide, polyethylene naphthalate (PEN), polyethylene terephthalate (PET), other suitable polymers, a combination of these polymers, etc. Other suitable substrates that may be used to form the substrate 314 include glass, metal foil covered with a dielectric, a multi-layer polymer stack, a thin glass film bonded to a thin polymer, a polymer composite film comprising a polymer material combined with nanoparticles or microparticles dispersed therein, etc.

A plurality of touch sensors 367 may be disposed on the OLED film stack 365. Optically clear adhesive (not shown) may be disposed between the touch sensors 367 and the OLED film stack 365 to facilitate the interface bonding therebetween. The touch sensors 367 may detect touch input based on changes in capacitance. For example, such capacitance change as detected between the electrodes in the touch sensors 367 may be used to determine the location where the touch input is received. Details regarding the configurations of the touch sensors 367 will be described below with reference to FIG. 6A-10.

Figure 4:
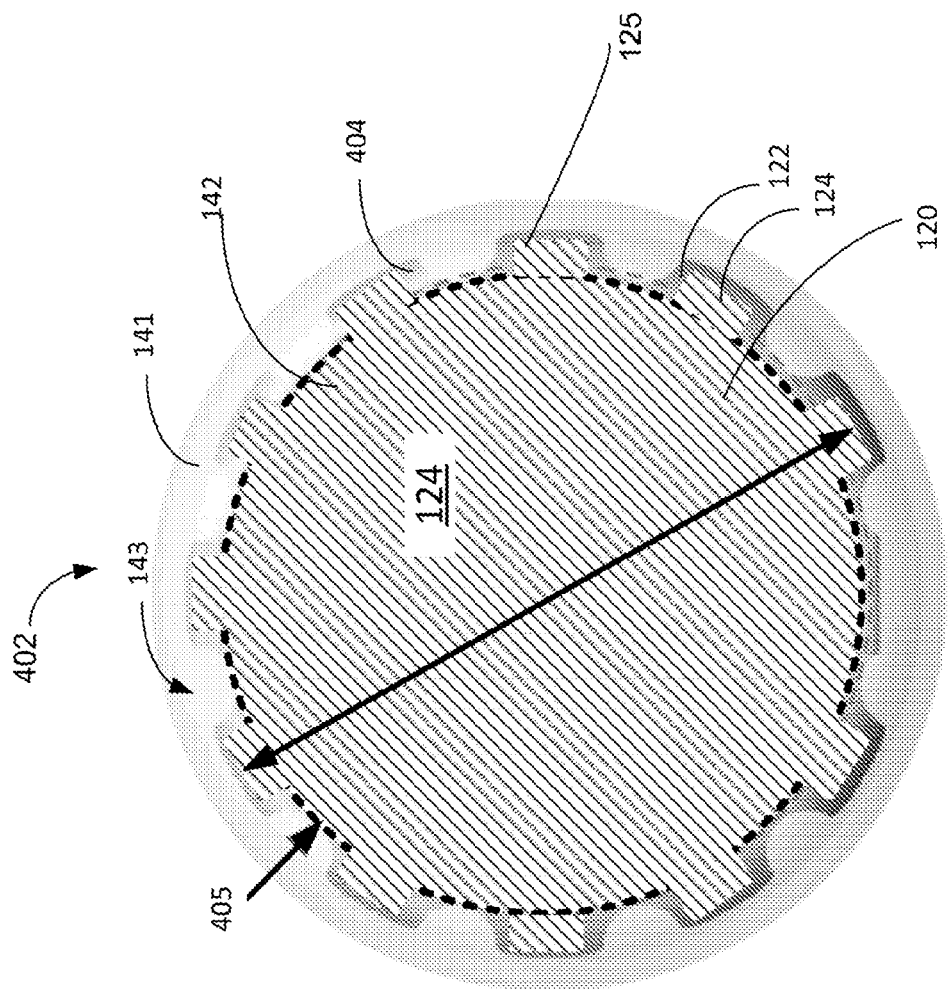
FIG. 4 depicts a top view of an active and touch sensitive area in the display assembly in accordance with aspects of the disclosure.

FIG. 4 depicts a top view of display assembly 402 with an extended dimension of active areas 124 as well as touch sensitive area formed in the display panels 142. The display assembly 402 depicted in FIG. 4 may be a top view of the smartwatch 100 depicted in FIG. 1. A plurality of relief features 143, such as cut-out portions, may be formed in the bending portions 122, forming a plurality of bendable flaps 125, to assist releasing local bending stress. In the example depicted in FIG. 4, the active area 124 is formed in the planar portion 120, and further extends to the bending portion 122 of the display panel 142. Thus, an inactive area 404 formed in the bending portion 122, such as in the bendable flaps 125, is relatively minimal. The relief features 143 formed in the bending portions 122 remove a portion of the active area from the display panel 142.

In one example, the bending portions 122 are bendable, such as the bendable flaps 125, that may create curved surfaces that fit with the curvature defined by the curved side region 162 of the cover layer 141. Thus, a good fitting interface may be obtained by the matching curvature therebetween, thus eliminating interface defects, cracks, or wrinkle during the lamination process. As the bending portions 122 are in connection with the planar portion 120, the bending portions 122 defined between the relief features 143 may be flared out from a circular edge 405 or perimeter of the planar portion 120.

In some examples, ink or other material may be applied to the cover layer 141 to cover or disguise the relief features 143 for overall aesthetic appearance of the display assemblies 402, 404. For example, the ink or other material may be applied in a pattern or mask that corresponds to the relief features 143. Further, the ink may be colored to match a color of the active area of the display assembly. As such, the relief features 143 may be hidden or disguised.

Figure 5:
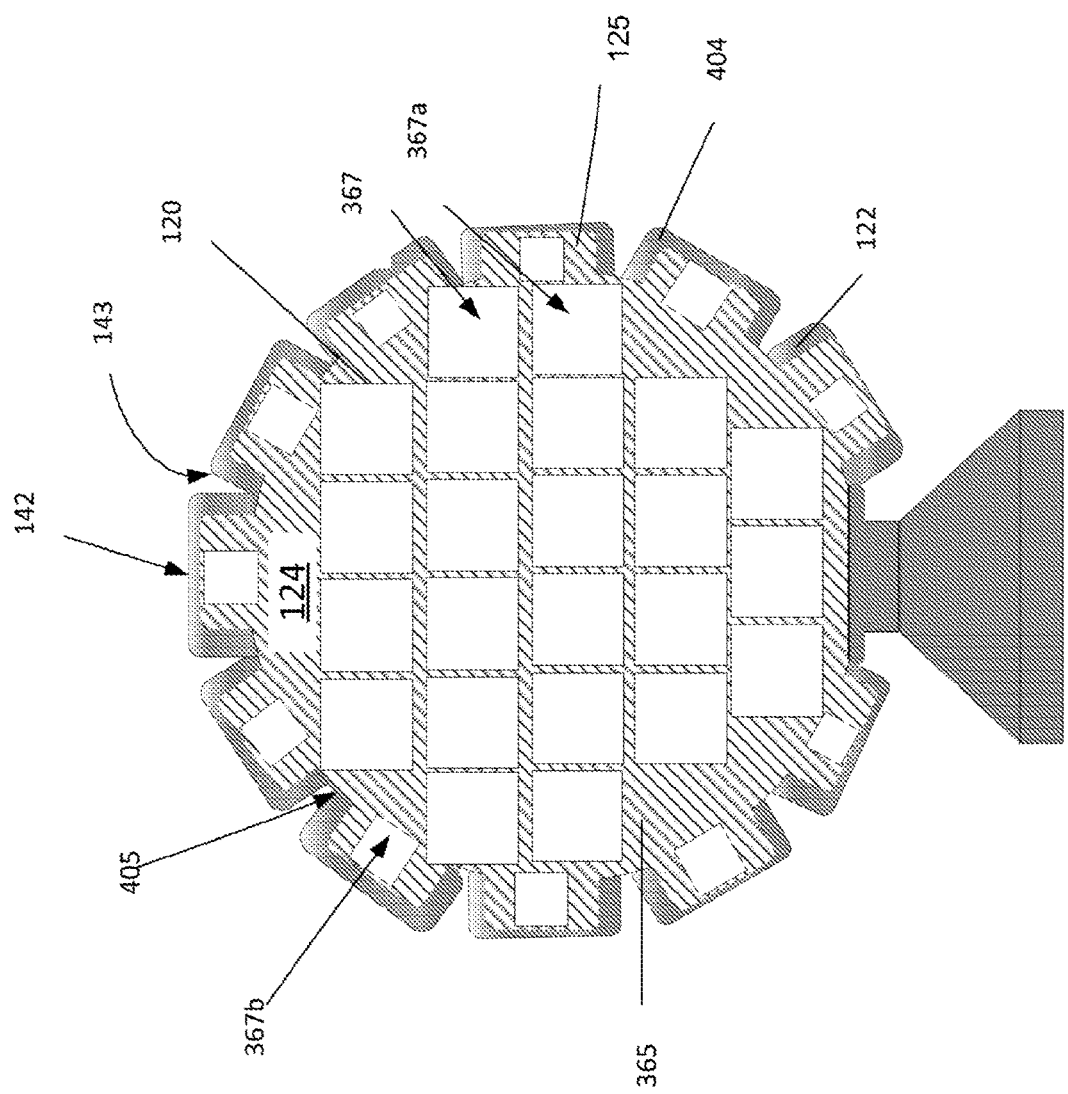
FIG. 5 depicts a top view of an example peripheral portion of a flexible display panel with multiple bendable flaps prior to bending to form a bezel region of the electronic device in accordance with aspects of the disclosure.

FIG. 5 depicts a top view of the display panels 142 with the plurality of touch sensors 367 disposed thereon. A first plurality of touch sensors 367a may be disposed on the planar portion 120 while a second plurality of touch sensors 367b may be disposed on the bending portions 122. The active region 124 includes the OLED film stack 365 configured to display images in the active region 124 in the planar portion 120 as well in the bending portions 122.

In the example depicted in FIG. 5, the touch sensors 367, also shown as 367a, 337b, may be formed on one or more of the bendable flaps 125 so that the bendable flaps 125 located in the bezel region of the smartwatch may also be touch sensitive and touch operable by the user. In one example, each bendable flap 125 may include one or more touch sensors disposed thereon so that each active area located in each bendable flap 125 is touch sensitive and touch operable. The touch sensors located in each bendable flap 125 may be electronically connected by wires to enable electrical communication therebetween.

FIG. 6A-6B, 7A-7B, 8A-8B, 9A-9B depict cross-sectional views and top views, respectively, of an example touch sensor utilized in the smartwatch 100 during different manufacturing stages in accordance with aspects of the disclosure. In one example, the touch sensor may be formed on a substrate 600. In the example depicted in FIG. 6A-6B, 7A-7B, 8A-8B, 9A-9B, the touch sensor may be a capacitive touch sensor that includes a transmitter electrode and a receiver electrode, or a sensor electrode, formed in a common layer, utilizing a jumper wire formed in the vias to route between the transmitter electrodes to facilitate the electrical communication therebetween, or a sensor electrode formed in a common layer as shown in the example depicted in FIG. 7A-7B.

As shown in FIG. 6A-6B, the substrate 600 where the touch sensors are formed may be similar to the substrate 314 having multiple structures formed thereon, such as the OLED film stack 365 formed on the substrate 600. Detailed structures formed in the OLED film stack 365 are eliminated in FIG. 6A-6B for ease of illustration. Though not shown in FIG. 6A-6B, additional layers, such as adhesive layer, passivation layer, or other suitable interface layers, may be formed on the top of the OLED film stack 365 or at the interface between the OLED film stack 365 and the substrate 600, or other suitable interfaces or surfaces.

In FIG. 7A-7B, a first metal layer 602 is formed on the substrate 600, as shown in FIG. 7A-7B. The first metal layer 602 may be later utilized to form a transmitter electrode, a receiver electrode or a jumper wire for any suitable sensor electrode arrangement. In some examples, the first metal layer 602 may be utilized to form a sensor electrode in a common layer. In one example, the first metal layer 602 may include a transparent conductive material, such as indium tin oxide (ITO) and the like. It is noted that the first metal layer 602 formed on the substrate 600 may be patterned or etched to form any suitable features or patterns in the first metal layer 602, as shown from the top view in FIG. 7B.

Figure 9B:
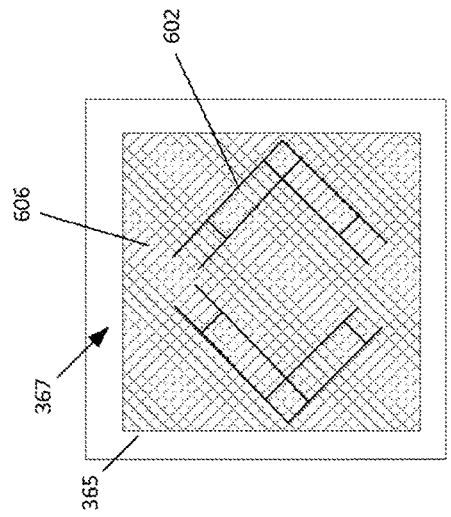
Figure 8B:
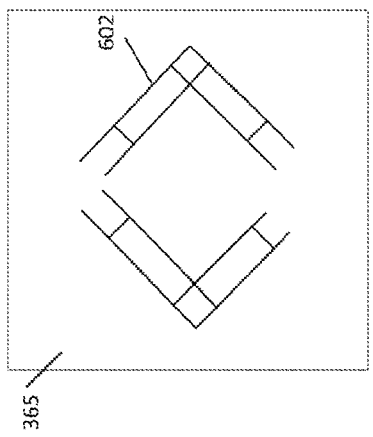
Figure 9A:
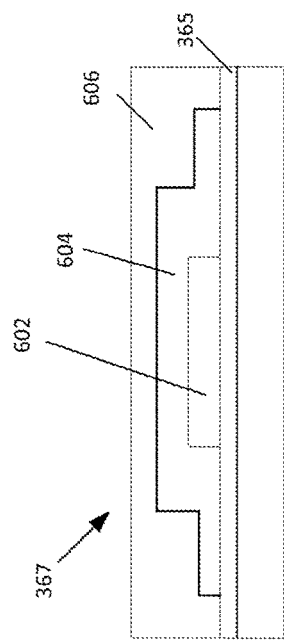
Figure 8A:
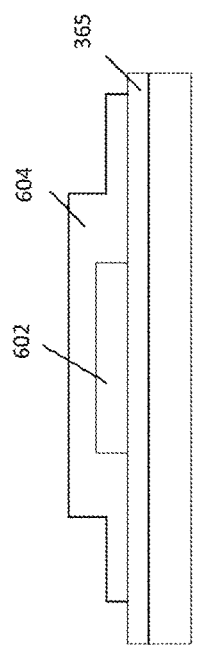

In FIG. 8A-8B, an insulating material 604 is formed on the first metal layer 602. The insulating material 604 may be any suitable dielectric material that may insulate electrical communication between the first metal layer 602 and a second metal layer 606, as shown in FIG. 9A-9B. In one example, the insulating material 604 may be a silicon oxide material or any suitable silicon containing material.

In FIG. 9A-9B, the second metal layer 606 is formed on the insulating material 604. The second metal layer 606 may be utilized to form a transmitter electrode, a receiver electrode or a jumper wire for any suitable sensor electrode arrangement. In one example, the transmitter electrode and the receiver electrode may be formed in a common layer, such as the second metal layer 606 while the jumper wire is formed in the first metal layer 602, or vice versa. In the example depicted in FIG. 9A-9B, the transmitter electrode and the receiver electrode are formed in substantially diamond shape in the second layer 606, as shown in the top view of FIG. 9B, while the jumper wire may be formed in the first metal layer 602 to be in electrical communication through a connection plug formed in the insulating material 604, which will be further described below with reference to FIG. 10.

The first metal layer 602 and the second metal layer 606 as well as the insulating material 604 formed in between in combination form a capacitive touch sensor that may detect and receive touch input from the user.

Figure 10B:
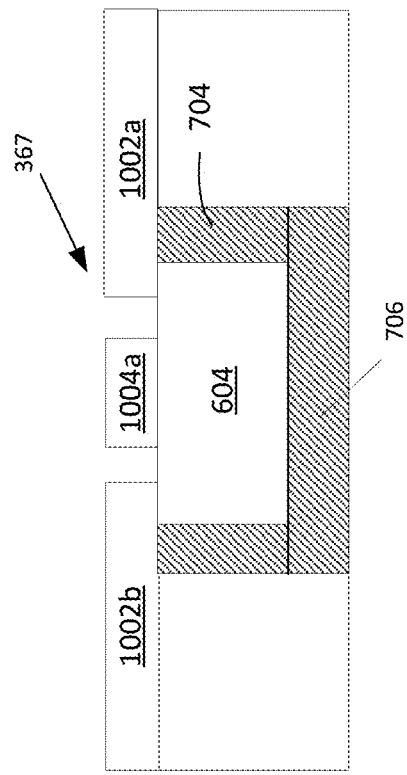
FIG. 10B depicts a cross sectional view of the touch sensor along the line A-A depicted in FIG. 10A.
Figure 10A:
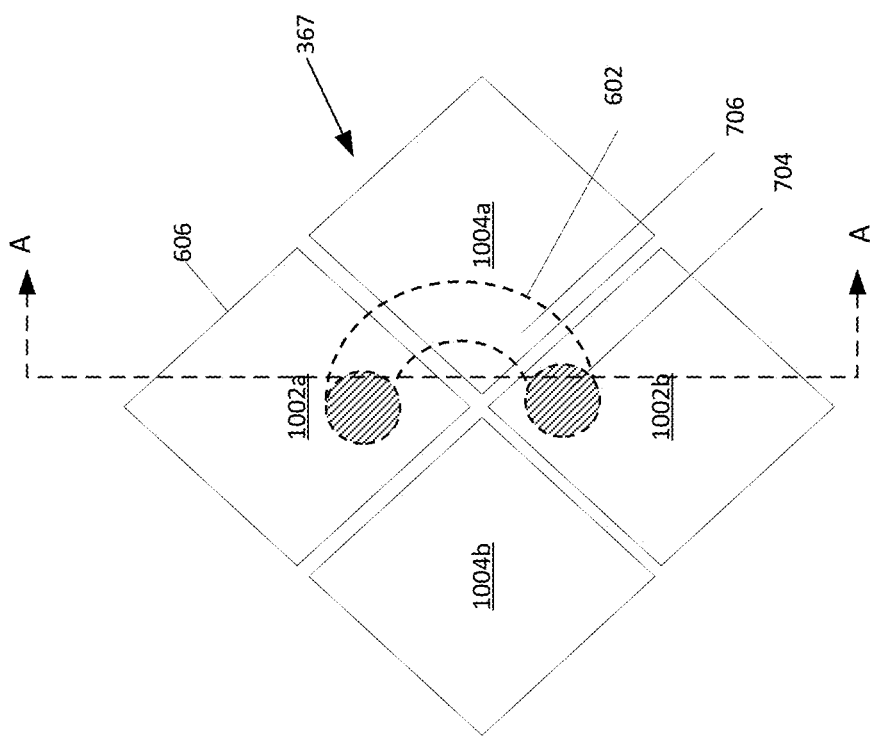
FIG. 10A depicts a top view of a layout of a portion of a touch sensor utilized in an electronic device having a flexible display panel with multiple bendable flaps in accordance with aspects of the disclosure.

FIG. 10A depicts a top view of a layout of a portion of the touch sensor 367 in accordance with aspects of the disclosure. The second metal layer 602 may be patterned and etched to form transmitter electrodes 1002a, 1002b and receiver electrodes 1004a, 1004b in any suitable shapes, such as diamond, rectangular, circular, star, square, non-convex, convex, non-concave, concave, etc. In the example depicted in FIG. 10A, the transmitter electrodes 1002a, 1002b and receiver electrodes 1004a, 1004b are substantially in diamond shape. The transmitter electrodes 1002a, 1002b are disposed proximate to the receiver electrodes 1004a, 1004b. By utilizing the transmitter electrodes 1002a, 1002b and the receiver electrodes 1004a, 1004b in a common layer, the touch input may be received by detecting the change in capacitive coupling between the transmitter electrodes 1002a, 1002b and the receiver electrodes 1004a, 1004b. The jumper wire 706 is formed in the first metal layer 602 that is in electrical communication with the transmitter electrodes 1002a, 1002b and/or the receiver electrodes 1004a, 1004b formed in the second metal layer 606 through the connection plug 704 formed in the insulating material 604.

FIG. 10B depicts a cross sectional view of the touch sensor 367 along the cutting line A-A depicted in FIG. 10A. As shown, the connection plug 704 is formed in the insulating material 604 to facilitate communication of the transmitter electrodes 1002a, 1002b through the jumper wire 706. The plurality of the transmitter electrodes 1002a, 1002b are coupled and communicated through the jumper wire 706. The jumper wire 706 is separated from the receiver electrodes 1004a, 1004b via the insulating material 604. In one example, the transmitter electrodes 1002a, 1002b are configured to transmit transmitter signal(s) and senses resulting signals from the receiver electrodes 1004a, 1004b. Thus, the detection of the capacitance change resulted from a touch input may be determined by the resulting signal received from the receiver electrodes 1004a, 1004b. The touch sensor 367 may be in communication with a processor, such as the processor 112 depicted in FIG. 2 to facilitate execution of touch commands from the user to the electronic device where the touch sensor 367 is formed.

Figure 11:
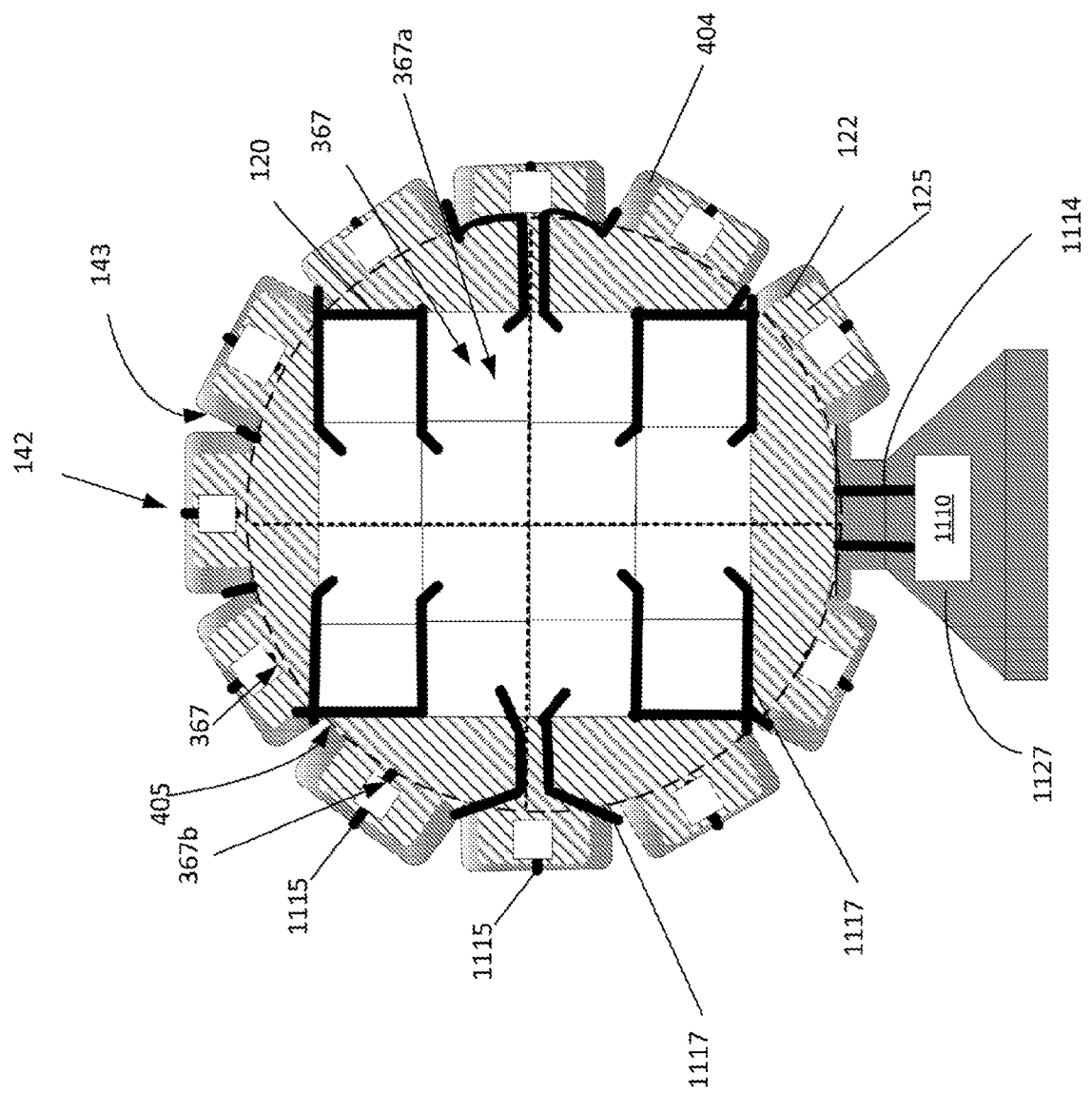
FIG. 11 depicts a top view of one example of a display assembly with routing wires around touch sensors disposed in the smartwatch in accordance with aspects of the disclosure.

FIG. 11 depicts a top view of the display panel 142 with routing wires 1117, shown in bold lines, disposed around the touch sensors 367 in the smartwatch 100 in accordance with aspects of the disclosure. As the touch sensors 367 are disposed both in the planar portion 120 as well as the bending portion 122 of the display panel 142, the routing wires 1112 as disposed therein may facilitate electrical connections and communications of the touch sensors 367 located at different regions, such as the planar portion 120 and the bending portion 122, to the DDIC 1110 and/or other suitable touch control integrated circuit. In one example, the routing wires 1117 may be formed on the same common layer where the transmitter electrodes or the receiver electrodes are formed.

In one example, each touch sensor 367, such as the second plurality of touch sensors 367b, located in each of the bendable flaps 125 may be connected to a conductive trace line 1115. The conductive trace line 1115 located in the bendable flaps 125 may then be in electrical connection to each other. Each touch sensor 367 of the one or more touch sensors disposed in each bendable flap 125 is connected in series. The conductive trace line 1115 from each bendable flap 125 may be collectively coupled to a display device integrated circuit (DDIC) 1110 to facilitate operation and control of the touch sensors. In one example, the conductive trace line 1115 may be disposed around or proximate to and in electrical communication with the DDIC 1110 to facilitate signal transmission. The conductive trace line 1115 may then be collectively merged to one or more connection pin 1114, to couple to the DDIC 1110 disposed on a tail portion 1127 of the display panel 142. A group of the routing wires 1117 may be in connection with the touch sensors 367, such as the first plurality of touch sensors 367a, located in the planar portion 120. The routing wires 1117 may run through the active area between the touch sensors 367. The routing wires 1117 may facilitate the communications among the touch sensors 367a located in the planar portion 120 to the DDIC 1110. The routing wires 1117 may be located at corners or boundaries of the first plurality of touch sensors 367a to collectively route the routing wires 1117 through edges of the display panel 142 to the DDIC 1110.

The tail portion 1127 may provide additional inactive area to facilitate forming the DDIC 1110 or other additional peripheral devices, drivers, or circuits thereon. Alternatively, the DDIC 1110 or other additional peripheral devices, drivers, or circuits may also be disposed on or in an accessory, such as a watch band, connected to a portion of the smartwatch 100. The location of the DDIC 1110 is selected to be in close proximity to the display panel 142 to minimize the electrical signal transmission or travelling electrical signal distance between the display panel 142 and the DDIC 1110. It is noted that other peripheral devices, drivers, or circuits may also be disposed at a location in close proximity to the display panel 142.

Figure 12A:
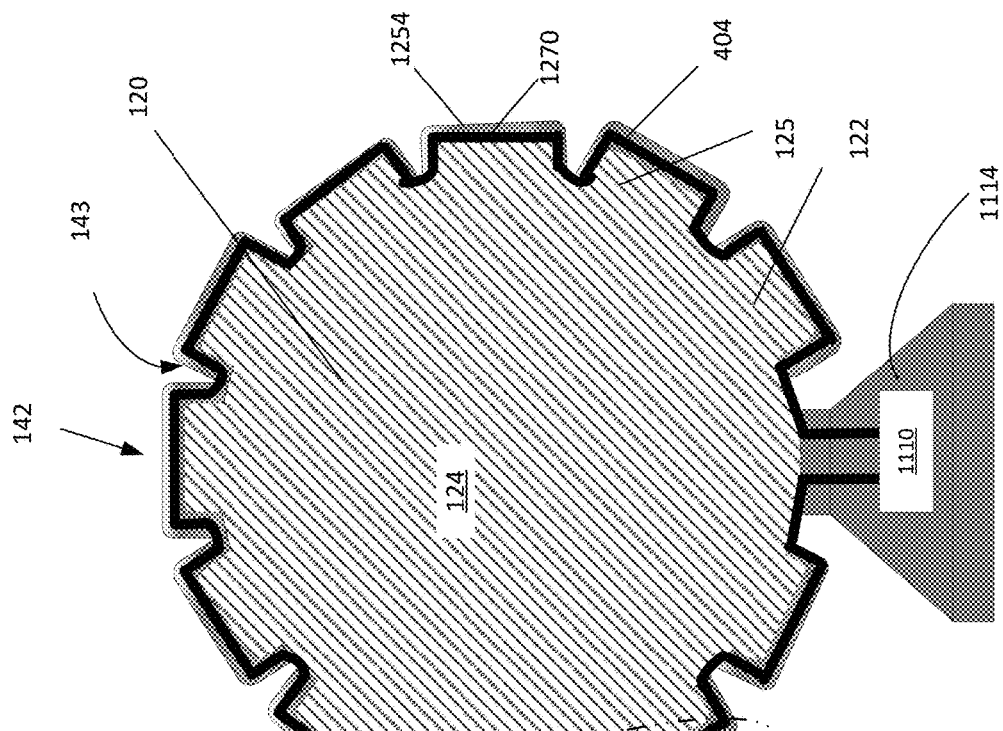
FIG. 12A depicts a top view of one example of a display assembly with routing wires at a bezel region of the smartwatch in accordance with aspects of the disclosure.
Figure 12B:
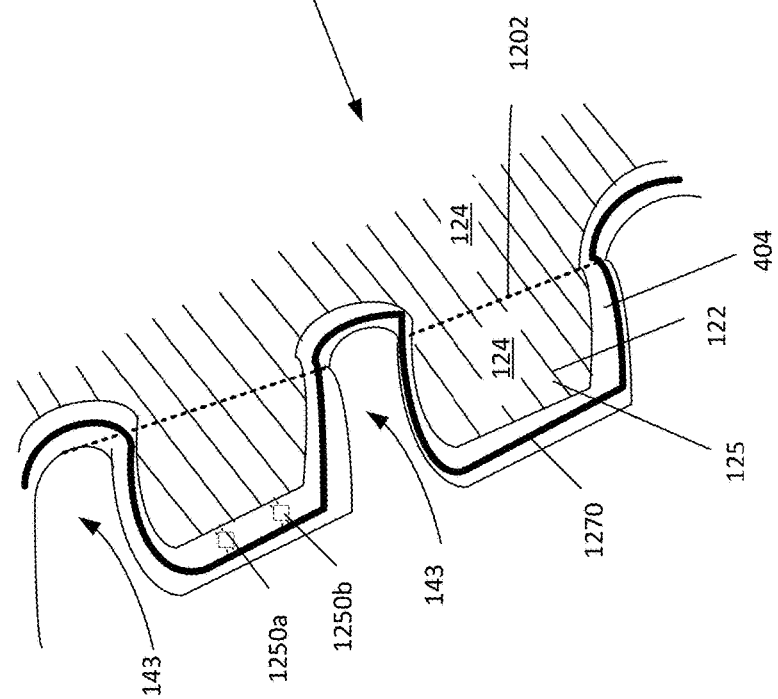
FIG. 12B depicts a magnified view of a portion of the bezel region of the display assembly of FIG. 12A in accordance with aspects of the disclosure.

FIGS. 12A-B depict another example of routing wires 1270 disposed around a perimeter 1254 of the display panel 142, such as along an edge of each of the bendable flaps 125. In the example depicted in FIG. 12A, the touch sensors located in active area 124 of the display panel 142 are not shown in this example for ease of illustration. The routing wires 1270 may be disposed in the inactive area 404 of the display panel 142 is close proximity to the active area 124 of the bendable flaps 125 of the display panel 142. FIG. 12B depicts a magnified view of a portion of the bending portion 122, such as the bendable flaps 125, of the display panel 142 with the active area 124 extending to the bending portion 122 along a bending line 1202. A plurality of bending lines 1202 may be formed in the display panel 142 so that the bending portion 122 may be bendable and/or foldable along the bending line 1202 to form the bendable flaps 125. The inactive area 404 in the bending portion 122 may provide space to facilitate positioning of various peripheral drivers as well as the routing wires 1270, circuitries or components, such as the drivers 1250a or circuits 1250b, thereon. The routing wires 1270 disposed around the perimeter 1254 of the bendable flaps 125 may be utilized to provide electrical connections among the touch sensors 367 as well as the drivers, circuitries or components to the processors or display panel 142 located at other locations of the smartwatch 100. Thus, the touch sensors as well as the peripheral drivers, circuitries or components may be folded to the side or even to a bottom side of the display panel 142 to maximize the displayable and touchable active areas formed on the front side and bezel region of the smartwatch 100.

It is noted that an area of the display panel 142 where the tail portion 1114 is attached to may be configured to have a relatively larger dimension of the relief feature, e.g., a relatively larger dimension of the cut-out structures, to facilitate coupling of the tail portion 1114 to the display panel.

The present disclosure provides a wearable device utilizing a flexible display panel with touch sensors formed in a planar portion as well as a periphery bending portion of the flexible display panel so as to extend a displayable and touch sensitive area of the display panel in a bezel region of the wearable device. The active area and the touch sensors formed in the bending portion of the flexible display panel may provide a wide viewing range and/or angle as well as an extended touch sensitive area for receiving a touch input from a user so that the area of utilization of the wearable device is increased and an overall aesthetic appearance of the wearable device is also enhanced.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A display assembly, comprising:
 a flexible display panel positioned beneath a cover layer, the flexible display panel having a planar portion formed on a center region of the flexible display panel and a bending portion formed at a periphery region of the flexible display panel, wherein the planar portion has a circular shape;
 a plurality of relief features formed in between the bending portions of the flexible display panel to form a plurality of bendable flaps in the periphery region of the flexible display panel, the plurality of relief features being cut-out portions or cut-out structures; and
 a first plurality of touch sensors formed on the plurality of bendable flaps of the flexible display panel.

2. The display assembly of claim 1, further comprising:
 a second plurality of touch sensors formed in the planar portion of the flexible display panel.

3. The display assembly of claim 2, wherein the second plurality of touch sensors is in electrical communication with a display device integrated circuit.

4. The display assembly of claim 3, wherein the second plurality of touch sensors is connected to the display device integrated circuit through routing wires routing around an edge of the plurality of bendable flaps.

5. The display assembly of claim 1, wherein the first plurality of touch sensors is in electrical communication with a display device integrated circuit through routing wires.

6. The display assembly of claim 1, wherein each bendable flap comprises one or more touch sensors from the first plurality of touch sensors.

7. The display assembly of claim 1, wherein the first plurality of touch sensors further comprises:
 a transmitter electrode and a receiver electrode formed in a common layer.

8. The display assembly of claim 7, further comprising:
 a jumper wire coupled to the transmitter electrode.

9. The display assembly of claim 8, wherein the jumper wire is formed in a metal layer below or above an insulating material in contact with the common layer.

10. The display assembly of claim 9, wherein the jumper wire is coupled to the transmitter electrode through a connection plug formed in the insulating material.

11. The display assembly of claim 1, wherein the first plurality of touch sensors further comprises a sensor electrode formed in a common layer.

12. The display assembly of claim 1, further comprising:
 an OLED film stack formed under the first plurality of touch sensors.

13. The display assembly of claim 12, further comprising:
 an optically clear adhesive disposed between the OLED film stack and the first plurality of touch sensors.

14. The display assembly of claim 1, wherein the display assembly is integrated in a wearable device.

15. The display assembly of claim 1, wherein the bending portions of the flexible display panel has a curvature that fits with a curved side region of the cover layer.

16. An electronic device, comprising:
 a cover layer; and
 a flexible display panel having a planar center region and a curved periphery region,
 wherein the curved periphery region comprises a plurality of bendable flaps and a plurality of relief features, the plurality of relief features being cut-out portions or cut-out structures and each of the plurality of relief features is provided between corresponding two of the plurality of bendable flaps and the planar center region has a circular shape, wherein the curved periphery region is touch sensitive.

17. The electronic device of claim 16, further comprising:
 each bendable flap of the plurality of bendable flaps comprising one or more touch sensors.

18. The electronic device of claim 17, further comprising:
 an OLED film stack formed below the one or more touch sensors.

19. The electronic device of claim 17, wherein each touch sensor of the one or more touch sensors disposed in each bendable flap is connected in series.

20. A method for forming a display assembly for an electronic device, comprising:
 forming a plurality of bendable flaps and a plurality of relief features in a periphery region of a flexible display panel, the plurality of relief features being cut-out portions or cut-out structures and each of the plurality of relief features being provided between corresponding two of the plurality of bendable flaps;
 folding a bendable flap of the flexible display panel; and
 forming one or more touch sensors in the plurality of the bendable flaps in the periphery region of the flexible display panel, wherein the flexible display panel has a planar portion formed on a center region of the flexible display panel and the planar portion has a circular shape.

* * * * *